(12) United States Patent
Shen et al.

(10) Patent No.: US 9,918,377 B1
(45) Date of Patent: *Mar. 13, 2018

(54) HEAT DISSIPATION APPROACH IN CHIP ON BOARD ASSEMBLY BY USING STACKED COPPER MICROVIAS

(71) Applicant: Google Inc., Mountain View, CA (US)

(72) Inventors: Zuowei Shen, Los Altos, CA (US); Kyle Fukuchi, San Jose, CA (US); Melanie Beauchemin, Mountain View, CA (US); Ryohei Urata, San Carlos, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/478,663

(22) Filed: Apr. 4, 2017

Related U.S. Application Data

(63) Continuation of application No. 14/678,230, filed on Apr. 3, 2015, now Pat. No. 9,641,254.

(Continued)

(51) Int. Cl.
*H05K 1/02* (2006.01)
*H05K 3/40* (2006.01)
*G02B 6/32* (2006.01)
*G02B 6/42* (2006.01)
*H01S 5/026* (2006.01)
*H05K 3/06* (2006.01)
*H05K 1/18* (2006.01)

(Continued)

(52) U.S. Cl.
CPC ............. *H05K 1/0206* (2013.01); *G02B 6/32* (2013.01); *G02B 6/428* (2013.01); *G02B 6/4269* (2013.01); *H01S 5/0261* (2013.01); *H04B 10/40* (2013.01); *H04B 10/801* (2013.01); *H05K 1/18* (2013.01); *H05K 3/061* (2013.01); *H05K 3/32* (2013.01); *H05K 3/4038* (2013.01); *H05K 2201/10121* (2013.01)

(58) Field of Classification Search
CPC ...... H05K 1/0206; H05K 3/4038; H05K 3/32; H05K 3/061; H05K 1/18; H05K 2201/10121; G02B 6/32; G02B 6/428; G02B 6/4269; H01S 5/0261; H04B 10/801; H04B 10/40
See application file for complete search history.

(56) References Cited

U.S. PATENT DOCUMENTS 7,561,805 B2    7/2009   Aoki et al.
8,231,284 B2    7/2012   Doany et al.
(Continued)

OTHER PUBLICATIONS

Office Action dated Aug. 24, 2016 in U.S. Appl. No. 14/678,230 (10 pages).

(Continued)

*Primary Examiner* — Leslie Pascal
(74) *Attorney, Agent, or Firm* — McDermott Will & Emery LLP

(57) ABSTRACT

The present disclosure discusses an improved optical transceiver. The optical transceiver of the present disclosure includes an optical transmitter and an optical receiver coupled to an area of a printed circuit board that includes a plurality of thermal microvias. The thermal microvias are coupled to a heat sink or other heat dissipater and provide a path from the components of the optical transceiver to the heat dissipater for heat to travel.

16 Claims, 6 Drawing Sheets

Related U.S. Application Data

(60) Provisional application No. 62/062,476, filed on Oct. 10, 2014.

(51) Int. Cl.
    *H04B 10/80* (2013.01)
    *H04B 10/40* (2013.01)
    *H05K 3/32* (2006.01)

(56) References Cited

U.S. PATENT DOCUMENTS

| | | | |
|---|---|---|---|
| 9,039,303 B2 | 5/2015 | Wang et al. | |
| 9,641,254 B1 * | 5/2017 | Shen | H04B 10/40 |
| 2003/0031430 A1 | 2/2003 | Jiang et al. | |
| 2003/0161588 A1 | 8/2003 | Wolf et al. | |
| 2003/0201462 A1 | 10/2003 | Pommer et al. | |
| 2004/0240803 A1 | 12/2004 | Rechberger et al. | |
| 2005/0078962 A1 | 4/2005 | Hofmeister et al. | |
| 2005/0084269 A1 | 4/2005 | Dalleasasse et al. | |
| 2005/0094686 A1 | 5/2005 | Aoki et al. | |
| 2005/0168957 A1 | 8/2005 | Kawauch I et al. | |
| 2005/0168963 A1 | 8/2005 | Togami et al. | |
| 2005/0244095 A1 | 11/2005 | Ellison | |
| 2005/0244110 A1 | 11/2005 | Togami et al. | |
| 2005/0271391 A1 | 12/2005 | Togami et al. | |
| 2008/0044127 A1 | 2/2008 | Leising et al. | |
| 2008/0069570 A1 | 3/2008 | Dallesasse | |
| 2009/0016722 A1 | 1/2009 | Smith et al. | |
| 2009/0067849 A1 | 3/2009 | Oki et al. | |
| 2009/0162051 A1 | 6/2009 | Hudgins et al. | |
| 2010/0067854 A1 | 3/2010 | Oki | |
| 2012/0076501 A1 | 3/2012 | Ko et al. | |
| 2012/0163811 A1 | 6/2012 | Doany et al. | |
| 2013/0188963 A1 | 7/2013 | Afriat et al. | |
| 2013/0330941 A1 | 12/2013 | Jeon | |
| 2013/0339559 A1 | 12/2013 | Tanaka | |
| 2014/0147127 A1 | 5/2014 | McColloch et al. | |
| 2014/0168903 A1 | 6/2014 | Clay | |
| 2014/0178079 A1 | 6/2014 | Yagisawa et al. | |
| 2014/0219609 A1 | 8/2014 | Nielson et al. | |
| 2014/0270765 A1 | 9/2014 | Cole | |
| 2015/0078760 A1 | 3/2015 | Kurashima | |
| 2015/0104177 A1 | 4/2015 | Kato et al. | |
| 2015/0253520 A1 | 9/2015 | Huang et al. | |
| 2015/0256259 A1 | 9/2015 | Huang et al. | |
| 2015/0256261 A1 | 9/2015 | Ho et al. | |
| 2015/0341118 A1 | 11/2015 | Wang et al. | |

OTHER PUBLICATIONS

Notice of Allowance dated Dec. 28, 2016 in U.S. Appl. No. 14/678,230 (5 pages).
Office Action dated Jul. 5, 2016 in U.S. Appl. No. 14/678,227 (15 pages).
Office Action dated Oct. 21, 2016 in U.S. Appl. No. 14/678,227 (18 pages).
Notice of Allowance dated Jan. 11, 2017 in U.S. Appl. No. 14/678,227 (5 pages).

* cited by examiner

US 9,918,377 B1

HEAT DISSIPATION APPROACH IN CHIP ON BOARD ASSEMBLY BY USING STACKED COPPER MICROVIAS

CROSS-REFERENCE TO RELATED APPLICATIONS

The present application is a continuation of, and claims priority to, U.S. patent application Ser. No. 14/678,230, titled "HEAT DISSIPATION APPROACH IN CHIP ON BOARD ASSEMBLY BY USING STACKED COPPER MICROVIAS" and filed on Apr. 3, 2015, which claims priority to U.S. Provisional Patent Application No. 62/062,476 filed on Oct. 10, 2014 and titled "Novel Heat Dissipation Approach In Chip On Board Assembly By Using Stacked Copper Microvias," both of which are herein incorporated by reference in their entirety.

BACKGROUND OF THE DISCLOSURE

Datacenter networks include a plurality of interconnected nodes. In some datacenters, the nodes are interconnected by optical links. The amount of data passed between the interconnected nodes is increasing. The increased amount of data transmission increases the power consumption of the optical transceivers within the interconnected nodes.

SUMMARY OF THE DISCLOSURE

According to one aspect of the disclosure, an optical transceiver includes an optical transmitter with a first chip-on-board package coupled to a printed circuit board (PCB) and an optical receiver including a second chip-on-board package coupled to the PCB. The PCB includes a plurality of thermal microvias. The optical transmitter and the optical receiver are positioned above a plurality of thermal microvias, and the thermal microvias are configured to draw thermal energy away from the optical transmitter and the optical receiver. The optical transmitter includes a light source electrically coupled with a driver circuit. The light source and the driver circuit are covered by a first lens. The optical receiver includes a light detector electrically coupled with a receiver circuit. The light detector and the receiver circuit are covered by a second lens.

According to another aspect of the disclosure, a method of manufacturing a printed circuit board includes, for each layer of the printed circuit board, providing a dielectric layer with a copper-coated face. The copper-coated face is machined. Thermal microvias are formed into the dielectric layer across predetermined areas. The thermal microvias are then filled with a thermally conductive material. The layers are then coupled together to form a PCB.

BRIEF DESCRIPTION OF THE DRAWINGS

The skilled artisan will understand that the figures, described herein, are for illustration purposes only. It is to be understood that in some instances various aspects of the described implementations may be shown exaggerated or enlarged to facilitate an understanding of the described implementations. In the drawings, like reference characters generally refer to like features, functionally similar and/or structurally similar elements throughout the various drawings. The drawings are not necessarily to scale, emphasis instead being placed upon illustrating the principles of the teachings. The drawings are not intended to limit the scope of the present teachings in any way. The system and method may be better understood from the following illustrative description with reference to the following drawings in which.

DETAILED DESCRIPTION

The various concepts introduced above and discussed in greater detail below may be implemented in any of numerous ways, as the described concepts are not limited to any particular manner of implementation. Examples of specific implementations and applications are provided primarily for illustrative purposes.

As an overview, as the data transfer rate of optical transceivers increases, the power required to operate the optical transceivers increases. The increase in power consumption can result in higher operating temperatures. Laser output can be impacted by temperature, and thus excessive operating temperatures can degrade transceiver performance. The present disclosure increases optical transceiver performance by reducing operating temperatures by placing a plurality of thermal microvias under the components of the optical transceiver. A standard printed circuit board is a poor conductor of thermal energy. Accordingly, the heat generated by the components of the optical transceiver cannot readily dissipate from components. The increased operating temperatures can reduce optical component (laser) reliability and degrade performance of the optical component. The thermal microvias are filled with a thermally conducting material (e.g., copper) and provide channels through the printed circuit board for the heat to travel. The thermal microvias can be coupled to heat spreaders or heat sinks that dissipate the heat generated by the components.

Figure 1:
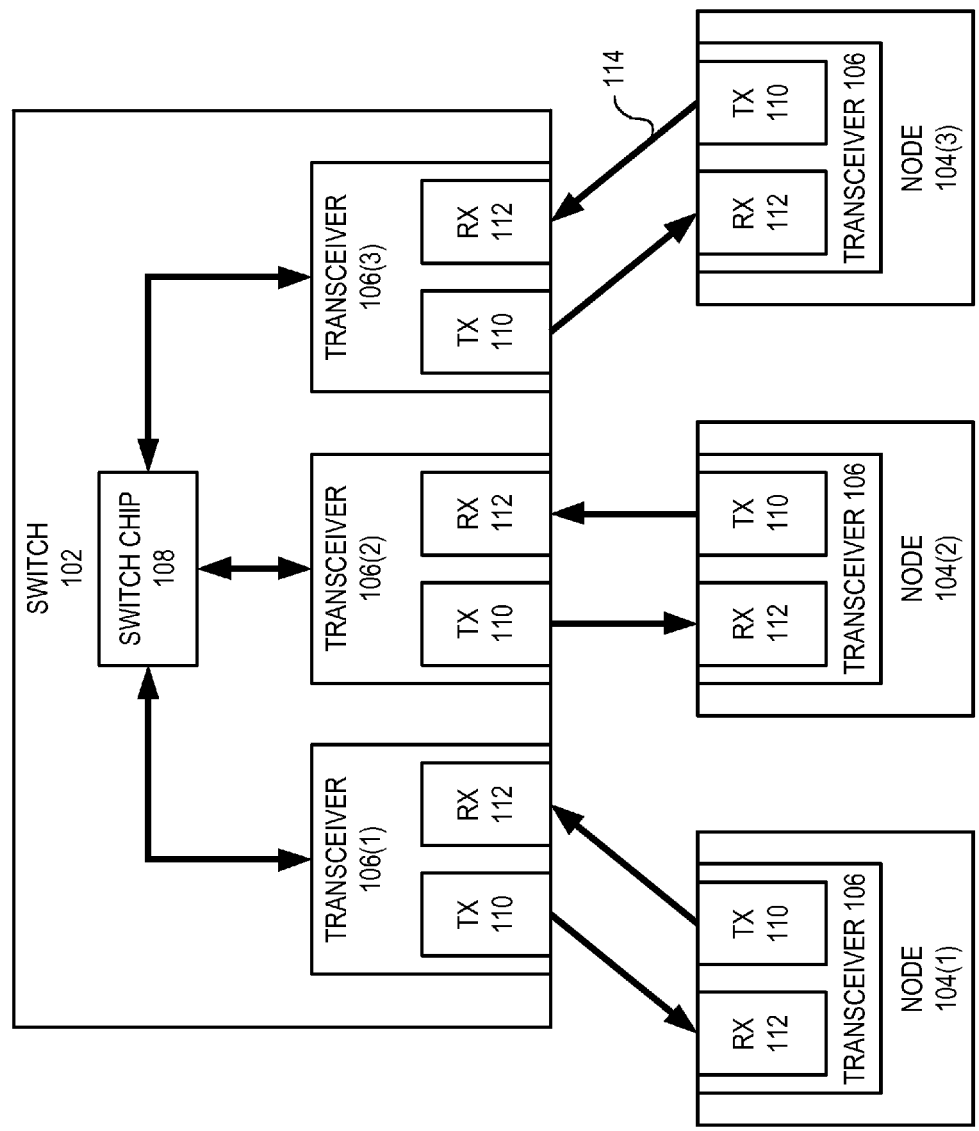
FIG. 1 illustrates an example data center network.

FIG. 1 illustrates an example data center network 100. The network 100 includes a switch 102 that is connected to nodes 104(1)-104(3) (generally referred to as nodes 104). The switch 102 includes transceivers 106(1)-106(3) (generally referred to as transceivers 106). Within the switch 102, the transceivers 106 are interconnected with one another through a switch chip 108, which handles the communication between each of the transceivers 106. Each of the transceivers 106 includes an optical transmitter 110 and an optical receiver 112. Each node 104 also includes a transceiver 106 with an optical transmitter 110 and an optical receiver 112. The optical transmitter 110 of a transceiver 106 is coupled with an optical receiver 112 of another transceiver 106 through an optical cable 114. In some implementations, the transceivers 106 of the switch 102 are configured differently than the transceivers of the nodes 104.

The switch 102 of the data center network 100 is an aggregation device that couples one or more nodes 104 together. The switch 102 routes data between the nodes 104, and in some implementations, other switches 102 or aggregation devices. As illustrated, the switch 102 includes three transceivers 106, enabling the switch 102 to connect to three nodes 104. In some implementations, the switch 102 includes 8, 12, 24, 32, 64, or more transceivers 106. The switch 102 facilitates the routing of data between nodes 104. In some implementations, the switch 102 is an optical packet switch that receives packets of data in the form of an optical signal. The switch 102 converts the optical signal into an electrical signal to extract the packet. The switch 102 reviews a header of each of the packets for routing information. The switch 102 can then select to which node 104 to route the data responsive to the routing information contained within the header of the packet. In some implementations, the switch 102 may reference a routing table stored in memory to determine to which node 104 the data is routed.

The switch 102 includes three transceivers 106. The transceivers 106 are discussed in greater detail in relation to FIG. 2A, but briefly, each of the transceivers 106 includes an optical transmitter 110 and an optical receiver 112 for communication with a node 104. Each of the optical transmitters 110 receives an electrical signal and converts the electrical signal into an optical signal for transmission over one of the optical cables 114. Conversely, each of the optical receivers 112 receives an optical signal and then converts the optical signal into an electrical signal. The optical transmitter 110 and the optical receiver 112 of each optical transmitter 110 are coupled to a common PCB, but are spatially separated in at least one direction. The optical transmitter 110 and the optical receiver 112 of each of optical transceivers are covered by separate lenses. The lenses focus the light generated by the optical transmitter 110 onto the optical cable 114 or focus the light received from an optical cable 114 onto a light detector within the optical receiver 112. In some implementations, the separation of the components reduces mechanical, thermal, and electrical cross talk between the optical transmitter and the optical receiver. The separation of the components can also ease the constraints of the optical alignment between the optical transmitter 110 and the optical receiver 112 and each of their respective lenses. In some implementations, the optical transmitter 110 and the optical receiver 112 are positioned on a common PCB such that the optical transmitter 110 and the optical receiver 112 can share a common lens.

In some implementations, the transceivers 106 are hot-pluggable transceivers. For example, the transceivers 106 may be in a quad, small form-factor pluggable (QSFP or QSFP+) housing. In other implementations, the transceivers 106 are configured in a small, form-factor pluggable (SFP) transceiver housing or other form factor used in data center network switches and routers.

The data center network 100 also includes a plurality of nodes 104. In some implementations, the nodes 104 are switches, routers, top-of-rack switches, servers, computers, a combination thereof, or any network connected devices that are configured to communicate with one another over optical cables 114.

The switch 102 and the nodes 104 of the data center network 100 are interconnected by optical cables 114. In some implementations, the optical cables 114 are short reach connections less than 100 m, although in some implementations, the length of the optical cable 114 is about 500 m. An optical cable 114 can include, but is not limited to, multi-mode fibers such as optical multi-mode (OM) 1, OM2, OM3, and OM4. In some implementations, the optical cables 114 are single mode fibers. In some implementations, each optical cable 114 includes more than one optical fiber connection. For example, when the transceiver 106 is configured as a QSFP transceiver, each optical cable 114 includes four optical fiber connections. In some implementations, the optical cable 114 coupled with the optical transmitter 110 and optical receiver 112 of a transceiver 106 are housed within a single cable. For example, each optical cable 114 may include four TX fibers and four RX fibers, though other numbers of TX and RX fibers can be included in other implementations.

Figure 2A:
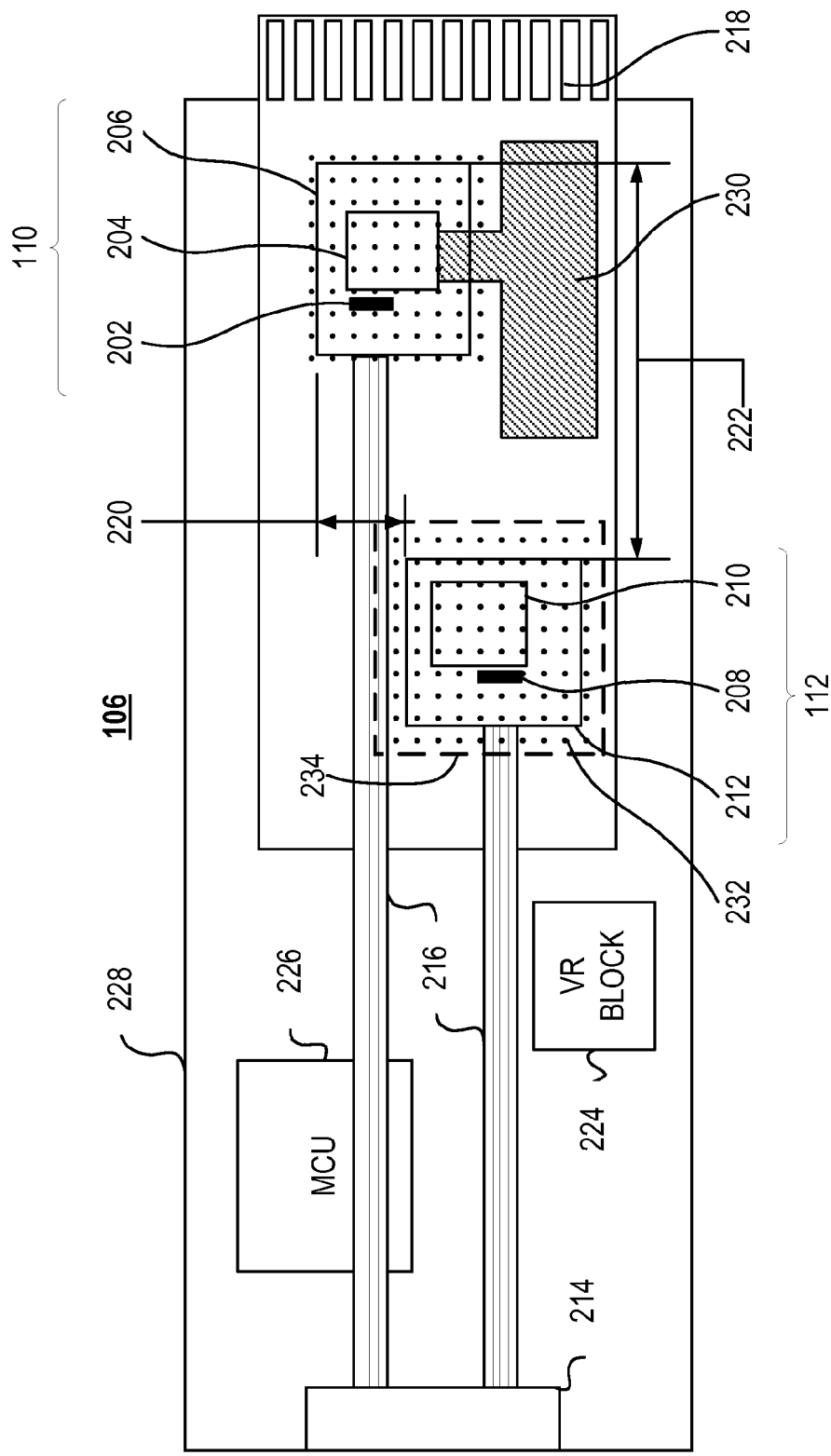
FIG. 2A illustrates an example transceiver for use in the example data center network of FIG. 1.

FIG. 2A illustrates an example transceiver 106 for use in the data center network 100. The transceiver 106 includes an optical transmitter 110 and an optical receiver 112 coupled to a shared PCB, each of the optical transmitter 110 and the optical receiver 112 is illustrated as an outline to reveal the PCB 228 below. The transceiver 106 includes a plurality of thermal microvias 232 within the PCB 228. The optical transmitter 110 includes a light source 202 and a driver circuit 204, and is covered by a first lens 206. The optical receiver 112 of the transceiver 106 includes a light detector 208 and a receiver circuit 210, and is covered by a second lens 212. The optical receiver 112 and optical transmitter 110 are each coupled to an optical connector 214 by fiber optic jumper cables 216. The transceiver 106 interfaces with the switch 102 through an edge connector 218. The optical transmitter 110 is offset from the optical receiver 112 in a first dimension by a first predetermined distance 220 and a second dimension by a second predetermined distance 222. The transceiver 106 also includes a voltage regulator (VR) block 224 and a microcontroller 226. The components of the transceivers 106 are coupled onto a printed circuit board (PCB) 228. The printed circuit board 228 includes a heat spreader 230, part of which is positioned under the optical transmitter 110.

Figure 2B:
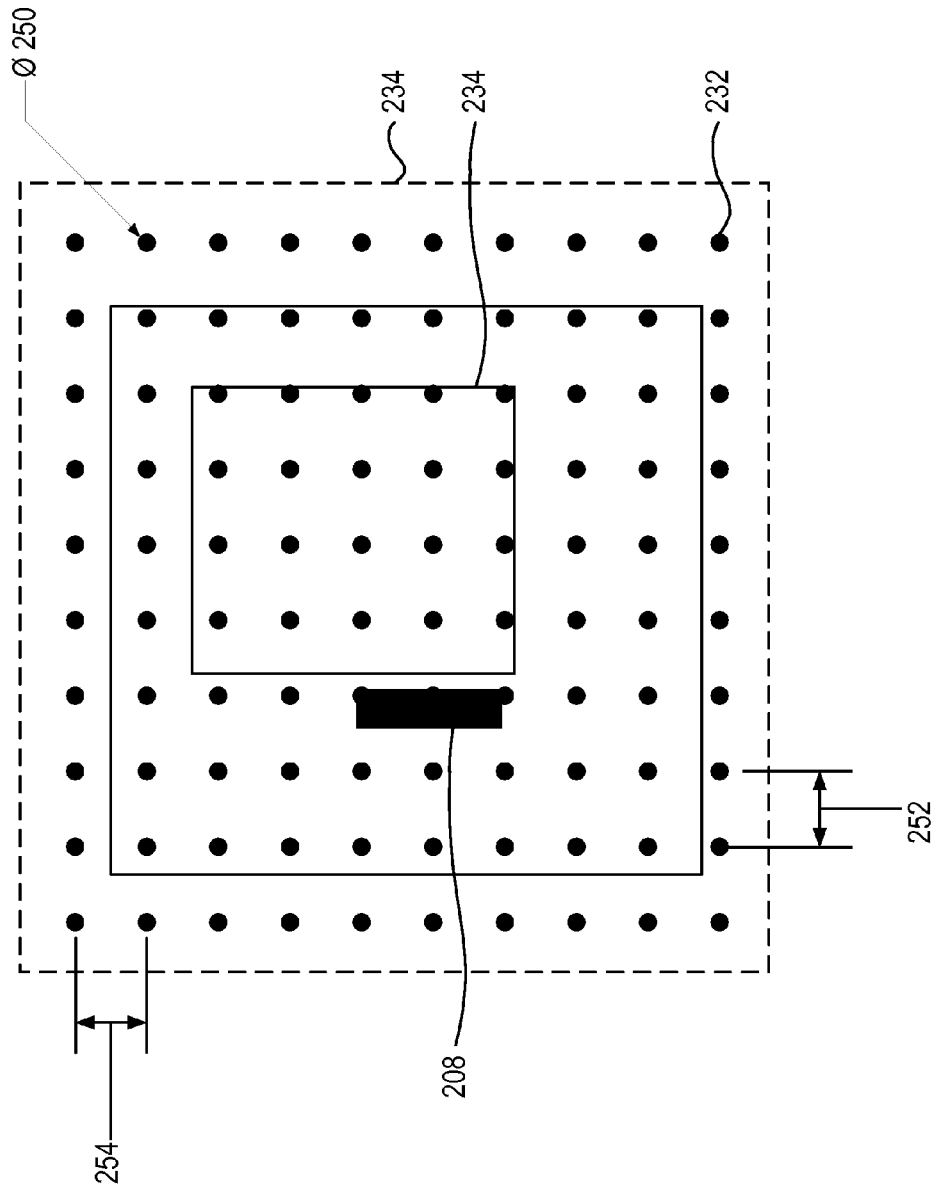
FIG. 2B illustrates an enlarged view of the thermal microvias included in the transceiver illustrated in FIG. 2A.
Figure 2C:
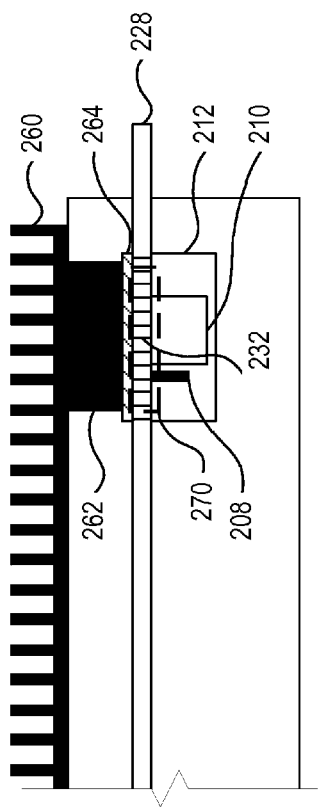
FIG. 2C illustrates a partial view of a cross-section of the transceiver illustrated in FIG. 2A.
Figure 2D:
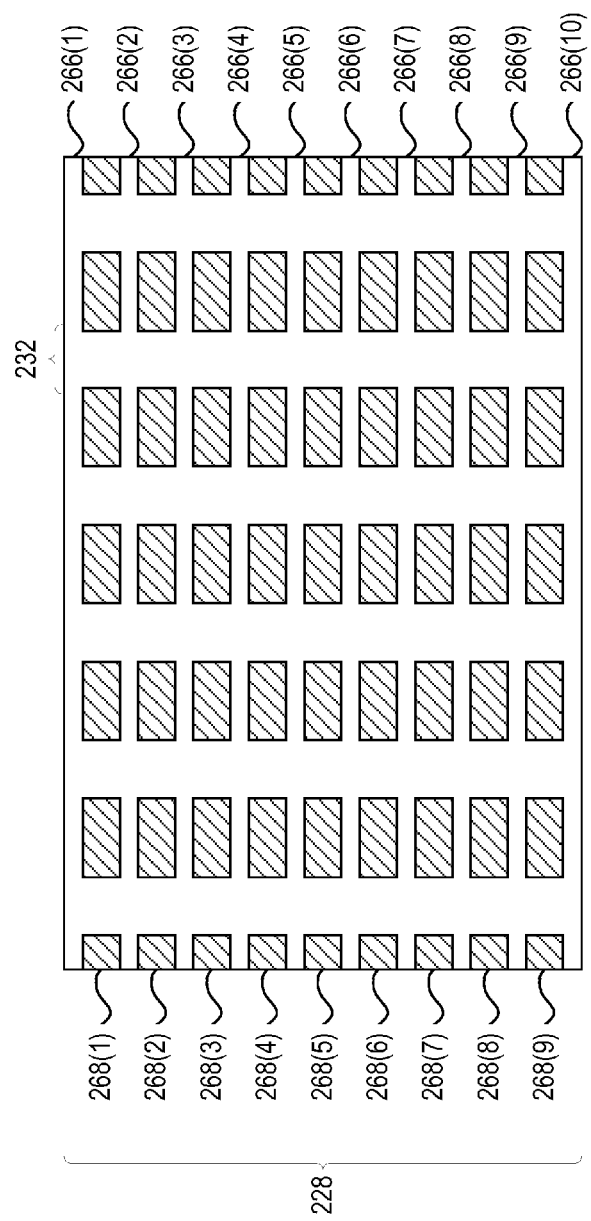
FIG. 2D illustrates an enlarged cross-section of the thermal microvias from the transceiver illustrated in FIG. 2A.

The thermal microvias 232 are discussed in greater detail in relation to FIGS. 2C-2D. Briefly, the thermal microvias 232 are placed within the PCB 228 around the location where the optical transmitter 110 and/or an optical receiver 112 are coupled to the PCB 228. The plurality of thermal microvias 232 carry heat away from the components coupled to the PCB 228. The thermal microvias 232 carry heat toward a heat dissipater, such as a heat sink or heat spreader. Each thermal microvia 232 includes a hole through the PCB 228 that is filled with a heat conducting material. In some implementations, the PCB 228 is a poor conductor of heat and the thermal microvias 232 provide a channel for heat to dissipate. As described herein, the driver circuit 204 and the receiver circuit 210 may be implemented as chip-on-board packages. The thermal microvias 232 can be used in combination with chip-on-board packages, flip-chip packages, or any other type of integrate circuit package or other component. In some implementations, circuits configured on a PCB with thermal microvias 232 operate at between about 5° C. and about 50° C., between about 5° C. to about 40° C., between about 10° C. and about 30° C., or between about 15° C. and about 25° C. cooler than compared with the same circuit configured on a PCB without such thermal microvias. While described herein in relation to optical transceivers, the thermal microvias 232 described herein can be incorporated into a PCB that includes any type of electronic circuit. As illustrated in FIG. 2A, the thermal microvias 232 are disposed at a first area of the PCB 228 beneath the optical transmitter 110 and at a second area of the PCB 228 beneath the optical receiver 112. In some implementations, the optical transmitter 110 and the optical receiver 112 are placed relatively close together (e.g., such that they may be placed under a single lens). In the these implementations, the thermal microvias 232 may be disposed at a single area of the PCB 228. In yet other implementations, the optical transmitter 110 and the optical receiver 112 may be spatially separated; however, the thermal microvias may be disposed across a single area that spans both the optical transmitter 110 and the optical receiver 112.

The edge connector 218 of the transceiver 106 enables the transceiver 106 to communicate with the motherboard of the switch 102. The edge connector 218 includes a plurality of gold-plated connectors and is referred to as a finger connector in some implementations. The edge connector 218 includes about 24 to about 120 connectors over which data and power is transmitted. Power from the motherboard of the switch 102 is supplied, via the edge connector 218, to the VR block 224. The VR block 224 supplies between about 1 V and about 5 V to the microcontroller 226 and the other active components of the transceivers 106.

The microcontroller 226 of the transceiver 106 controls the operation of the transceiver 106. The microcontroller 226 is a single or multicore processor that is capable of executing computer executable instructions, such as programs and scripts. In some implementations, the microcontroller 226 controls the conversion of electrical signals into optical signals for transmission by the optical transmitter 110 and the conversion of optical signals into electrical signals received by the optical receiver 112.

The optical transmitter 110 and the optical receiver 112 of the transceiver 106 transmit and receive, respectively, optical signals. Optical signals enter and exit the transceiver 106 via the optical connector 214 via. The optical connector 214 is coupled with each of the optical transmitter 110 and optical receiver 112 via a fiber optic jumper cable 216. As illustrated, a separate fiber optic jumper cable 216 couples the optical connector 214 to each of the optical transmitter 110 and the optical receiver. In some implementations, when the light source 202 is an array of light sources and the light detector 208 is an array of light detectors, the number of fibers within each fiber optic jumper cable 216 matches the number of light sources or light detectors in each of the arrays. For example, the transceiver 106 is illustrated in a Quad-SFP configuration. Accordingly, each of the fiber optic jumper cables 216 includes four fibers. The fiber optic jumper cable 216 can be coupled to an MT ferrule or other optical terminal. The optical terminal is coupled with the optical connector 214, such as an MPO connector or other multi-fiber connector, which accepts the optical cable 114.

The optical transceiver 106 includes an optical transmitter 110. In general, the optical transmitter 110 refers to the region of the PCB 228 where the driver circuit 204 and the light source 202 are coupled to the PCB, and which is covered by the first lens 206. The driver circuit 204 and the light source 202 are covered by the first lens 206. In some implementations, the driver circuit 204 is an integrated circuit (IC). In some implementations, the light source 202 includes one or more light sources configured in an array. In some implementations, the light source 202 includes one or more VCSELs (vertical-cavity surface-emitting laser). Each of the one or more light sources 202 are aligned with one of the fibers in the outgoing fiber optic jumper cable 216. In some implementations, the driver circuit 204 is a 4-channel VCSEL driver with an integrated CDR (clock data recovery). In other implementations, the driver circuit 204 does not include a CDR. The driver circuit 204 modulates the current delivered to the light source 202, controlling the light output of the light source 202. As described further in relation to FIG. 3, the first lens 206 includes an optical surface that focuses the light generated by the light source 202 into a respective fiber of the fiber optic jumper cable 216. In some implementations, the driver circuit 204 is configured in a chip-on-board package. In a chip-on-board configuration, the bare die (e.g., the unpackaged semiconductor) of the driver circuit 204 is mounted directly onto the PCB 228 board. Wire bonds are made between the contacts of the bare die and the traces of the PCB. An epoxy is then applied over the bare die, encapsulating the bare die and the wire bonds. The chip-on-board configuration is in contrast to standard packaging system where the bare die is mounted within a package, which is then mounted to a PCB. For example, in a small outline package (SOP), the bare die is packaged within the SOP. Internally, wire connections are made between the contacts of the bare die and the SOP pins. The SOP is surface mounted to a PCB. In some implementations, chip-on-board packages are advantageous to other packaging designs because they have a smaller footprint and because the bare die can sit directly on a heat spreader.

The optical transceiver 106 also includes an optical receiver 112. In general, the optical receiver 112 refers to the region of the PCB 228 where the receiver circuit 210 and the light detector 208 are coupled to the PCB, and which is covered by the second lens 212. Light travels toward the optical receiver 112 through the fiber optic jumper cable 216 and is projected onto the light detector 208. The optical surfaces within the second lens 212 focus the light exiting each of the fibers of the fiber optic jumper cable 216 onto the light detector 208. In some implementations, the light detector 208 includes an array of light detectors, such as an array of photodiodes. The light detector 208 is electrically coupled with the receiver circuit 210. In some implementations, the receiver circuit 210 is configured in a chip-on-board package. The receiver circuit 210 includes a transimpedance amplifier (TIA) and a CDR. In some implementations, the receiver circuit 210 does not include a CDR. The TIA is a current to voltage regulator, which converts the current generated by the light detector 208 as light hits the light detector from the fiber optic jumper cable 216 into an electrical signal. The CDR generates a clock signal that is used to phase align the received signal, such that the received optical signal may be accurately converted into a digital signal.

The optical transmitter 110 and the optical receiver 112 are spatially separated from one another and are covered by a respective lens. As illustrated in FIG. 2A, the optical transmitter 110 and the optical receiver 112 are separated along a first dimension by a predetermined distance 220 and a second dimension by a predetermined distance 222. In some implementations, when the optical transmitter 110 and the optical receiver 112 are spatially separated from one another along both the first and second dimensions it is referred to as staggering the optical transmitter 110 and the optical receiver 112. In some implementations, the distance of the separation, in either dimension, is between about 1 mm and about 10 mm, between about 2 mm and about 7 mm, or between about 2 mm and about 5 mm. In some implementations, the optical transmitter 110 and the optical receiver 112 are separated along only one dimension—for example the first dimension. In some implementations, the predetermined distance 220 in the first dimension is greater than the predetermined distance 222 in the second dimension. For example, the predetermined distance 220 in the first dimension may be between about 4 mm to about 10 mm and the predetermined distance 222 in the second dimension may be between about 0 mm and about 5 mm.

In some implementations, separating the optical transmitter 110 and the optical receiver 112 and the placement of each under a separate lens provides a number of benefits. For example, and as further described in relation to FIG. 3, the placement accuracy of the lens with respect to the light source 202 and the light detector 208 is improved. Also, dissipation of the heat generated by the driver circuit 204 and the receiver circuit 210 is improved. As described above, the receiver circuit 210 and the driver circuit 204 may each include an integrated CDR. ICs with integrated CDRs can consume more power than ICs without integrated CDRs. The higher power consumption increases the operating temperature of the IC, which can affect the optical transmitter 110 and the optical receiver 112. In some implementations, the performance and reliability of the VCSEL (or, in general, the light source 202) is sensitive to increased temperatures. By moving the optical receiver 112 away from the optical transmitter 110, the heat generated by the receiver circuit 210 is less likely to affect the light source 202. Also, separating and placing the optical transmitter 110 and the optical receiver 112 under separate lenses, enables the optical transmitter 110 to be placed atop the heat spreader 230.

Still referring to FIG. 2A, the transceiver 106 also includes a heat spreader 230. In some implementations, one or more components of the optical transmitter 110 or one or more components of the optical receiver 112 sit atop portions of different heat spreaders 230. In some implementations, the driver circuit 204 and the receiver circuit 210 are configured in chip-on-board packages, and can sit atop the heat spreader 230 without shorting electrical connections. The heat spreader 230 draws heat away from the components that sit atop the heat spreader 230 (the driver circuit 204 in FIG. 2A) and lowers the operating temperatures of the component. The heat spreader 230 can be a copper or other metal plane on the PCB 228 that wicks heat away from the components. In some implementations, the heat spreader 230 is coupled to the housing of the transceiver 106 or a heat sink.

FIG. 2B illustrates an enlarged view of the thermal microvias 232 included in the transceiver 106 illustrated in FIG. 2A. More particularly, FIG. 2B enlarges the region of the transceiver 106 indicated by the box 234. As illustrated, the PCB 228 includes a plurality of thermal microvias 232 that substantially cover the portion of the PCB 228 where the one or more components of the optical transmitter 110 or one or more components of the optical receiver 112 couple to the PCB 228. The thermal microvias 232 have a diameter 250 and are spaced a first distance 252 apart along a first direction and a second distance 254 apart along a second direction. The diameter 250 of the thermal microvias 232 can be between about 2 mil (where 1 mil is one thousandth of an inch) and about 8 mil, between about 2 mil and about 6 mil, or between about 3 mil and about 5 mil. In some implementations, the diameter 250 of the thermal microvias 232 is less than about 4 mil. In some implementations, the first distance 252 and the second distance 254 is between about 2 mil and about 20 mil, between about 5 mil and about 15 mil, or between about 10 mil and about 15 mil. In some implementations, the first distance 252 and the second distance 254 are the same length—for example, each distance can be about 12 mil. In other implementations, the first distance 252 and the second distance 254 may be different distances. In some implementations, the spacing between the thermal microvias 232 can change along one or more dimensions. For example, the packing density can increase (e.g., the thermal microvias 232 can be placed more closely to one another) near components that generate relatively more heat and the packing density can decrease (e.g., the thermal microvias 232 can be placed further apart) near components that generate relatively less heat. As illustrated in FIG. 2B, the thermal microvias 232 cover an area roughly equivalent to the footprint of the second lens 212. In some implementations, the thermal microvias 232 may expand past the footprint of the second lens 212 or may cover an area smaller than the footprint of the second lens 212.

FIG. 2C illustrates a partial view of a cross-section of the transceiver 106. In the partial side view of the transceiver 106, the receiver circuit 210 and the light detector 208 are coupled to the PCB 228. Thermal microvias 232 run through the multiple layers of the PCB 228 and are coupled with a copper pad 264. The copper pad 264 is disposed on the opposite side of the PCB 228 as the receiver circuit 210. The layers of the PCB 228 are discussed in greater detail in relation to FIG. 2D. The copper pad 264 is coupled to the housing of the transceiver 106 and to a heat sink 260 through a direct connection 262. The box 270 indicates the region of the transceiver 106 that is enlarged in FIG. 2D.

In some implementations, the heat sink 260 and the direct connection 262 enable passive dissipation of the heat generated by the circuitry of the transceiver 106. Heat generated by the circuitry of the transceiver 106 passes from the circuitry through the thermal microvias 232 to the copper pad 264. Typically, a PCB is a good thermal insulator, which prohibits the dissipation of heat generated by components coupled to the PCB. The thermal microvias 232 provide a path away from the components towards components, such as heat sinks, that can dissipate the heat. The thermal energy generated by the circuitry is then transmitted to the direct connection 262 and the heat sink 260 where the thermal energy can be dissipated into the environment. Thermal grease or thermal adhesives can be used at the points of contact between thermal microvias 232, the copper pad 262, the direct connection 262, and/or the heat sink 260. Thermal grease can also be added to the fins of the heat sink 260. In some implementations, the heat sink 260 and the direct connection 262 include an aluminum alloy or other highly thermal conductive metal such as copper or a composite material.

FIG. 2D illustrates an enlarged cross-section of the PCB 228. The enlarged region of the PCB 228 is indicated by the box 270 in FIG. 2C. The PCB 228 includes a plurality of layers. As illustrated the PCB 228 includes ten copper layers 266(1)-266(10), generally referred to as copper layers 266. A dielectric layer 268 is sandwiched between each of the copper layers 226. As illustrated the PCB 228 includes nine dielectric layers 268 (dielectric layers 268(1)-268(9)). The thermal microvias 232 run vertically through the copper layers 266 and the dielectric layers 268. FIG. 2D illustrates six thermal microvias 232 running vertically through the PCB 228.

In some implementations, the dielectric layer 268 includes a prepreg material. The prepreg material can include FR-2 (phenolic cotton paper), FR-3 (cotton paper and epoxy), FR-4 (woven glass and epoxy), FR-5 (woven glass and epoxy), FR-6 (matte glass and polyester), G-10 (woven glass and epoxy), CEM-1 (cotton paper and epoxy), CEM-2 (cotton paper and epoxy), CEM-3 (non-woven glass and epoxy), CEM-4 (woven glass and epoxy), or CEM-5 (woven glass and polyester). Each dielectric layer 268 is between about 0.5 mil and about 4 mil, between about 1 mil and about 3.5 mil, or between about 1.5 mil and about 3 mil thick. In some implementations, the center dielectric layer 268 (or the "core") is thicker than the other dielectric layers 268. For example, the core may be about 3.7 mil while the other dielectric layers 268 are about 2.7 mil thick.

The copper layers 226 of the PCB 228 can be etched to form the traces of the PCB 228. In some implementations, the different copper layers 266 are each used for a predetermined purpose within the circuitry of the PCB 228. For example, from top to bottom, the copper layers 266 of the PCB 228 can include a high frequency layer (e.g., for the transmission of high frequency signals), a ground layer, a power or low frequency layer (e.g., for the transmission of low frequency signals), a ground layer, a power layer, a lower layer, a ground layer, a low speed layer, a ground layer, and a high speed layer. In some implementations, the number of copper layers 266 and dielectric layers 268 is between about 2 and about 10 or between about 4 and about 8. The number of layers can be dependent on the complexity of the circuit implemented on the PCB 228. For example, a more complex circuit may include more traces and more components. The example PCB may include extra layers for the routing of the additional traces. In some implementations, the overall thickness of the PCB 228 remains the same irrespective of the number of layers contained within the PCB 228. For example, the dielectric layers 268 may be thinner in PCBs 228 with more layers, when compared to PCBs 228 with fewer layers. In some implementations, the overall thickness of the PCB 228 is between about 25 mil and about 45 mil, between about 30 mil and about 40 mil, or between about 35 mil and about 40 mil.

In some implementations, the PCB 228 is manufactured from a plurality of copper-coated sheets which are individually machined and stacked to form the PCB 228. Each copper-coated sheet includes a dielectric layer 268 that is copper-coated on one or more faces. For example, the PCB 228 may include a core formed from a copper-coated sheet that includes a dielectric layer 268 with a laminated copper layer 266 on either major face of the dielectric layer 268. Four copper-coated sheets (with only one copper face each) can then be coupled to the top of the core, and a second set of four copper-coated sheets (with only one copper face) can then be coupled to the bottom of the core layer. Each copper-coated sheet can be milled and etched prior to being added to the stack that forms the PCB 228. For example, a mask can be used to pattern the traces and other copper components into the copper layer 266, and the holes that form the thermal microvias 232 can be laser drilled through the copper layer 266 and the dielectric layer 268. In some implementations, the drilled hole can be filled with copper using an electro-platting process.

Figure 3:
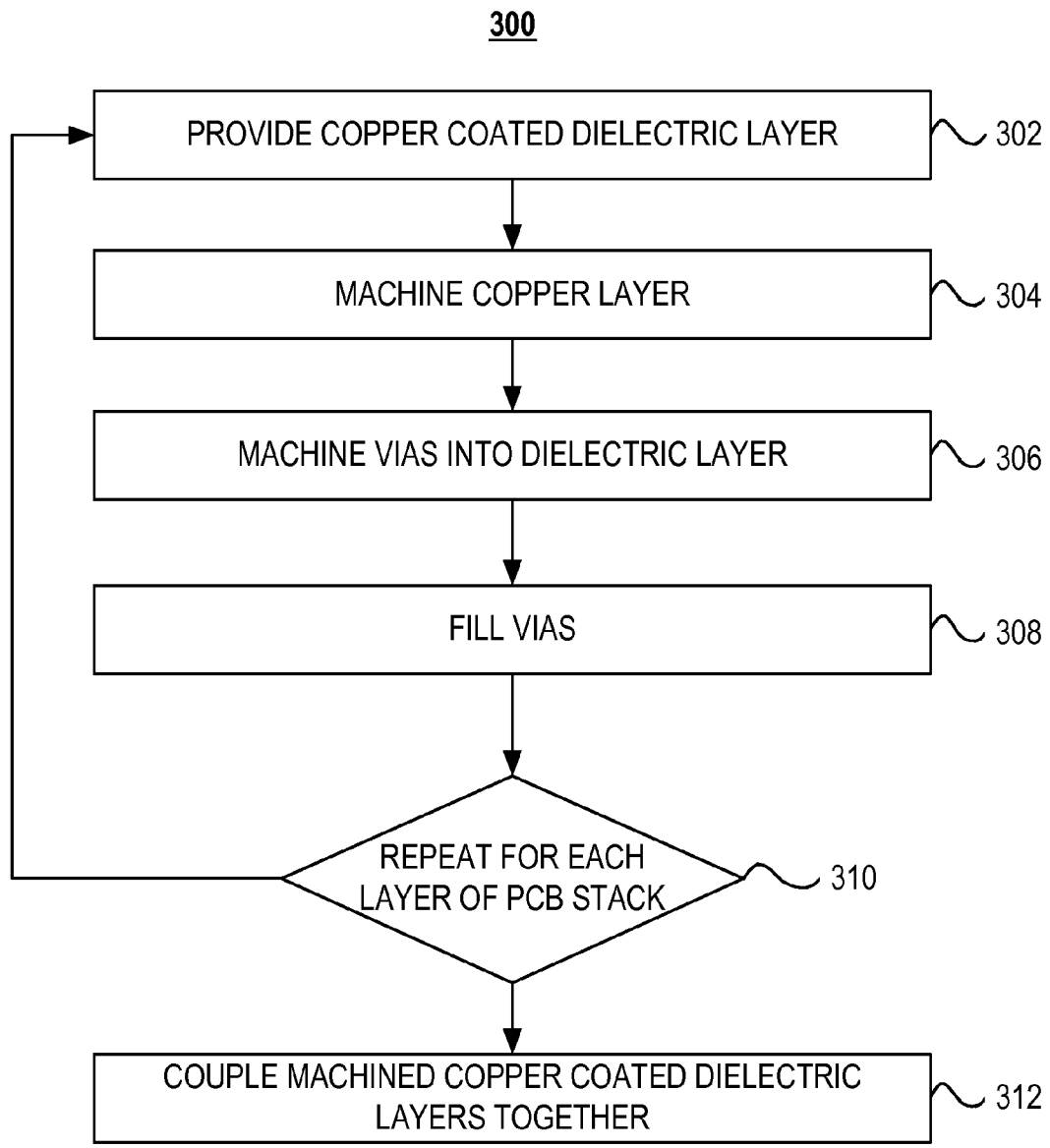
FIG. 3 illustrates a flow chart of an example method for manufacturing a PCB with thermal microvias for use in the transceiver illustrated in FIG. 2A.

FIG. 3 illustrates a flow chart of an example method 300 for manufacturing a PCB with thermal microvias. A copper-coated dielectric layer is provided (step 302). The copper layer of the copper-coated dielectric layer is machined (step 304) and the vias are machined into the dielectric layer of the copper-coated dielectric layer (step 306). The vias are then filled (step 308). Steps 302-308 are repeated for each of the layers to be included in the final PCB (step 310). Responsive to preparing each of the layers, the machined copper-coated dielectric layers are coupled together (step 312).

As set forth above, the method 300 of manufacturing a PCB with thermal microvias includes providing a copper-coated dielectric layer (step 302). The copper-coated dielectric layer can include a prepreg material with a copper layer laminated onto the top and/or bottom surfaces of the prepreg. In some implementations, the copper layer is laminated onto the prepreg by the application of heat and pressure for a predetermined amount of time.

The copper layer of the copper-coated dielectric layer is then machined (step 304). Machining the copper layer of the copper-coated dielectric layer can include etching traces and other copper components into the copper layer. In some implementations, the copper layer is machined by applying a mask to the copper layer and then chemically etching away the exposed ("unwanted") copper portions. In other implementations, the excess copper can be removed by laser etching or by milling.

The dielectric layer of the copper-coated dielectric layer is also machined (step 306). The machining of the dielectric layer can include shaping the copper-coated dielectric layer to the appropriate footprint of the final PCB and drilling electrical vias through the dielectric layer. Holes for thermal microvias can also be formed in the dielectric layer. In some implementations, the holes for the thermal microvias have a diameter less than 4 mil. The holes for the thermal microvias can be laser drilled.

The holes for the thermal microvias are then filled (step 308). In some implementations, the holes for the thermal microvias are filled with copper or another thermally conductive material. The holes are filled through an electrodeposition process. In some implementations, the holes for the thermal microvias are substantially filled with copper through the electrodeposition process. In other implementations, only the walls of the holes are filled and the void within the hole is filled with a thermal paste.

Steps 302-308 are repeated for each of the copper-coated dielectric layers (step 310). In some implementations, the PCB includes 10 copper layers. In these examples, if the core layer is a double, copper-coated dielectric layer, the steps 302-308 are repeated nine times. In other implementations, the PCB may include between 2 and 8 or between 4 and 6 copper layers, and the steps 302-308 may be repeated the appropriate number of times.

The machined copper-coated dielectric layers are then coupled together (step 312). In some implementations, the machined, copper-coated dielectric layers are stacked and aligned with one another and then coupled together. The machined, copper-coated dielectric layers may be stacked and aligned with an automated optical placement system. In some implementations, pressure and heat is applied to the stack to couple the layers of the stack together and form a single PCB. In some implementations, an adhesive can be placed between one or more of the machined, copper-coated dielectric layers to couple the layers together. In some implementations, the above described steps for manufacturing the PCB are performed in an additive process. For example, a first copper layer is laminated onto a first dielectric layer. The first copper layer is etched to form the traces and other circuit patterns. The thermal microvias are then laser drilled into the first dielectric layer and filled with an electrolytic copper plating process to complete the first layer. A second dielectric is coupled to the first copper layer and a second copper layer is laminated onto the second dielectric layer. The steps of etching the copper layer, forming the thermal vias and adding additional layers is repeated until the PCB includes the proper number of copper and dielectric layers.

In some implementations, the exposed copper on the top and bottom surfaces of the formed PCB can be plated with solder, nickel, gold, or another anti-corrosive material. A solder mask can also be applied to the top and bottom surfaces of the PCB to protect the PCB. A legend may be silk screened onto the PCB. The legend can include identification information such as manufacture, serial number, and circuit component indicators.

Figure 4:
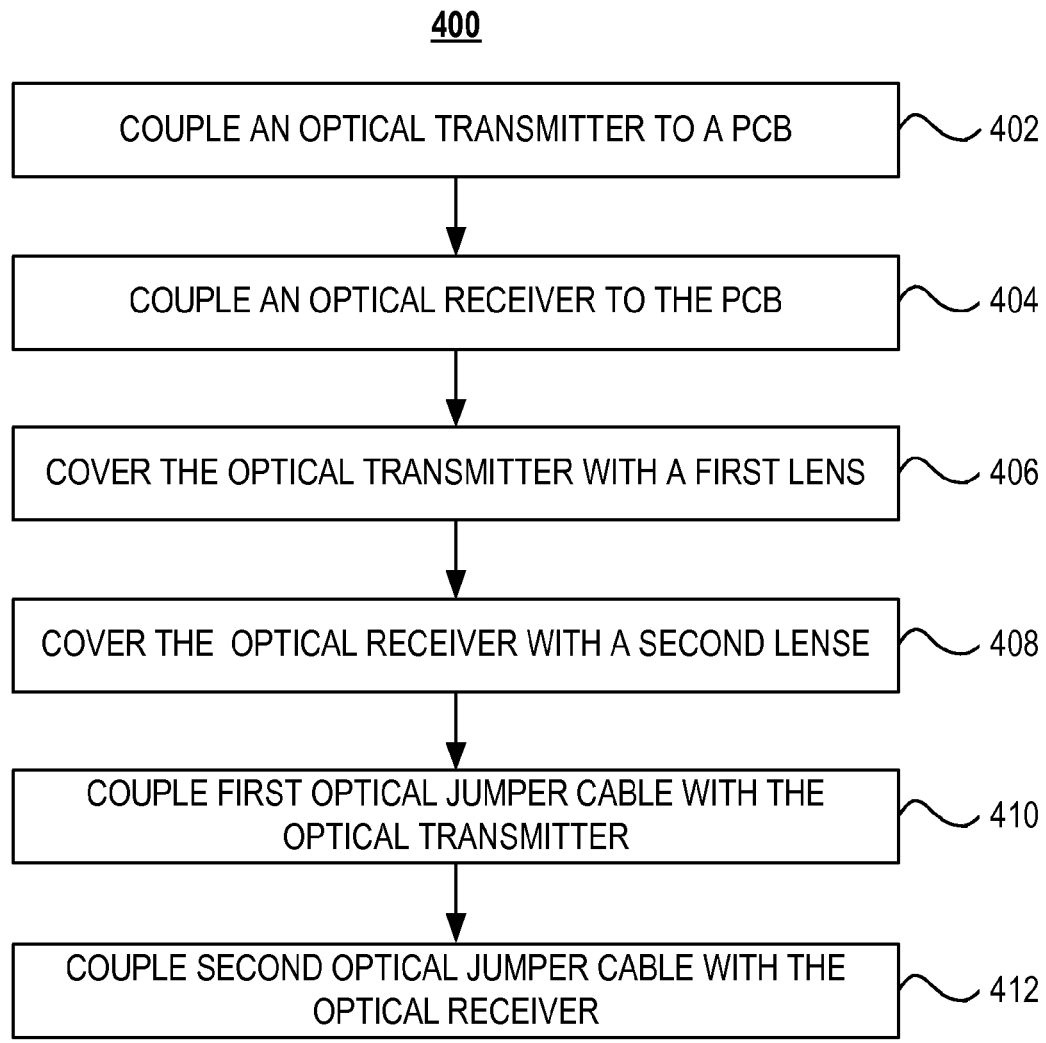
FIG. 4 illustrates a flow chart of an example method for manufacturing the transceiver for use in the example of data center network of FIG. 1.

FIG. 4 illustrates an example method 400 for manufacturing an optical transceiver. The method 400 includes coupling the components of an optical transmitter to a printed circuit board (PCB) (step 402). The components of an optical receiver are also coupled to the PCB (step 404). The optical transmitter is covered with a first lens (step 406) and the optical receiver is covered with a second lens (step 408). A first optical jumper cable is then coupled with the optical transmitter (step 410) and a second optical jumper cable is coupled with the optical receiver (step 412).

As set forth above, the method 400 includes coupling the components of an optical transmitter to a PCB (step 402). In some implementations, the PCB is a PCB with thermal microvias that is manufactured using the method described in relation to FIG. 3. In some implementations, the optical transmitter includes one or more components configured in a chip-on-board package. For example, the driver circuit may be configured in a chip-on-board package. The optical transmitter includes a light source electrically coupled with a driver circuit. In one implementation, the driver circuit, as a bare die, may be bonded to the PCB with an adhesive. The contacts of the bare die are wire bonded to electrical contacts on the PCB. The bare die may then be covered with an encapsulating epoxy to form the chip-on-board package. In some implementations, the bare die is not covered with an encapsulating epoxy, and a lens can cover and protect the bare die. The light source may be surface mounted to the PCB. One or more electrical traces within the PCB can electrically couple the driver circuit to the light source. In other implementations, the driver circuit is wire bonded to the light source. In some implementations, the light sources includes a laser such as, but not limited to, a VCSEL or an array thereof. The optical transmitter includes a CDR in some implementations. To facilitate heat dissipation, in some implementations, one or more components of the optical transmitter are placed on a heat spreader. For example, the optical transmitter driver circuit can be placed on a heat spreader, such as a copper plane in the PCB, that wicks heat away from the driver circuit.

The method 400 also includes coupling the components of an optical receiver to the PCB (step 404). In some implementations, the PCB is a PCB with thermal microvias that is manufactured using the method described in relation to FIG. 3. The components of the optical receiver can be coupled with the PCB using similar methods to the methods used to couple the components of the optical transmitter to the PCB. For example, the optical receiver can be a bare die that is coupled to the PCB in a chip-on-board configuration. The optical receiver is spatially separated from the optical transceiver in one or more directions. In some implementations, the optical receiver is placed between 2 mm and 5 mm away from the optical transmitter in a first and/or second direction. The optical receiver includes a light detector, such as a photodiode, or an array of light detectors and a receiver circuit. The receiver circuit includes a CDR. In some implementations, one or more components of the receiver circuit are placed on a heat spreader to disperse heat generated by the optical receiver. In some implementations, the optical transmitter and the optical receiver are coupled with different heat spreaders.

A first lens is placed on the PCB to cover the optical transmitter (step 406). The first lens is configured to focus light generated by the light source onto one or more fibers of a fiber optic jumper cable that is used to transmit the light from the optical transmitter to the exterior of the optical transceiver. The generated light is focused on to fibers by one or more optical surfaces within the lens. In some implementations, the first lens covers the driver circuit and the light source of the optical transmitter. The first lens can protect the optical transmitter from mechanical trauma and dust. For example, the first lens may replace (or supplement) the epoxy that is typically used to protect the wire bonds that form the electrical connects between the PCB and a chip-on-board package.

A second lens is placed on the PCB to cover the optical receiver (step 408). The second lens is a different lens than the first lens used to cover the optical transmitter. The second lens includes one or more optical surfaces that focus the light exiting a fiber optic cable onto a light detector of the optical receiver. The second lens covers the light detector and the receiver circuit of the optical receiver. In some implementations, the first lens and the second lens have the same design. For example, the lenses are designed with transmitting optical surfaces and receiving optical surfaces. Accordingly, when placing the first lens, the transmitting optical surfaces of the first lens are aligned with the light source of the optical transmitter. When placing the second lens, the receiving optical surfaces of the second lens are aligned with the light detector of the optical receiver. The second lens can protect the optical receiver from mechanical trauma and dust.

The method 400 also includes coupling a first optical jumper cable with the optical transmitter (step 410). In some implementations, the optical jumper cable carries light from the optical transmitter to an optical connector. The optical connector couples an external optical cable to the optical transceiver. The optical connector can be an MPO connector or other multi-fiber connector. In some implementations, the lens of the optical transmitter includes one or more alignment posts that assist in the alignment of the fibers within the optical jumper cable with the optical surfaces of the lens.

A second optical jumper cable is then coupled with the optical receiver (step 412). The second optical jumper cable carries light from the optical connector to the optical receiver. In some implementations, the optical connector is the same optical connector to which the first optical jumper cable is coupled. For example, the optical connector may be used to both transmit and receive data from the optical transceiver. In some implementations, the lens of the optical receiver includes one or more alignment posts that assist in the alignment of the fibers within the optical jumper cable with the optical surfaces of the lens.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated in a single product or packaged into multiple products.

What is claimed:

1. An optical transceiver comprising:
   an optical transmitter comprising a first chip-on-board package coupled to a printed circuit board (PCB) and an optical receiver comprising a second chip-on-board package coupled to the PCB, the optical transmitter and the optical receiver positioned above a plurality of thermal microvias configured to draw thermal energy away from the optical transmitter and the optical receiver;
   the optical transmitter comprising a light source electrically coupled with a driver circuit; and
   the optical receiver comprising a light detector electrically coupled with a receiver circuit, wherein the light source and the driver circuit are covered by a first lens and the light detector and the receiver circuit are covered by a second lens.

2. The device of claim 1, wherein each of the plurality of thermal microvias include a thermally conductive metal.

3. The device of claim 1, wherein the driver circuit comprises a VCSEL driver circuit and a clock and data recovery (CDR) circuit.

4. The device of claim 2, wherein the thermally conductive metal is a metal used to form one or more traces on the PCB.

5. The device of claim 1, wherein a diameter of each of the plurality of thermal microvias is between about 2 mil and about 6 mil.

6. The device of claim 1, wherein a diameter of each of the plurality of thermal microvias is between about 2 mil and about 4 mil.

7. The device of claim 1, wherein each of the plurality of thermal microvias are spatially separated from one another in a first dimension by a distance between about 5 mil and about 15 mil and from one another in a second dimension by a distance between about 5 mil and about 15 mil.

8. The device of claim 1, wherein the first chip-on-board package is spatially separated from the second chip-on-board package in a first dimension by a first distance of between about 2 mm and about 10 mm.

9. The device of claim 8, wherein the optical transmitter is separated from the optical receiver in a second dimension by a second distance between about 2 mm and about 5 mm, and the second distance is greater than the first distance.

10. The device of claim 1, wherein the receiver circuit comprises a transimpedance amplifier (TIA) and a clock and data recovery (CDR) circuit.

11. An optical transceiver comprising:
    an optical transmitter comprising a first chip-on-board package coupled to a printed circuit board (PCB) and an optical receiver comprising a second chip-on-board package coupled to the PCB, the optical transmitter and the optical receiver positioned above a plurality of thermal microvias configured to draw thermal energy away from the optical transmitter and the optical receiver;
    the optical transmitter comprising a light source electrically coupled with a driver circuit; and
    the optical receiver comprising a light detector electrically coupled with a receiver circuit, wherein the light source, the driver circuit, the light detector, and the receiver circuit are covered by a single lens.

12. The device of claim 11, wherein each of the plurality of thermal microvias include a thermally conductive metal.

13. The device of claim 11, wherein a diameter of each of the plurality of thermal microvias is between about 2 mil and about 6 mil.

14. The device of claim 11, wherein each of the plurality of thermal microvias are spatially separated from one another in a first dimension by a distance between about 5 mil and about 15 mil and from one another in a second dimension by a distance between about 5 mil and about 15 mil.

15. The device of claim 11, wherein the first chip-on-board package is spatially separated from the second chip-on-board package in a first dimension by a first distance of between about 2 mm and about 10 mm.

16. The device of claim 15, wherein the optical transmitter is separated from the optical receiver in a second dimension by a second distance between about 2 mm and about 5 mm.

* * * * *